United States Patent
Yoshihiro et al.

(10) Patent No.: US 10,707,171 B2
(45) Date of Patent: Jul. 7, 2020

(54) ULTRA SMALL MOLDED MODULE INTEGRATED WITH DIE BY MODULE-ON-WAFER ASSEMBLY

(71) Applicant: Intel Corporation, Santa Clara, CA (US)

(72) Inventors: Tomita Yoshihiro, Tsukuba (JP); Eric J. Li, Chandler, AZ (US); Shawna M. Liff, Scottsdale, AZ (US); Javier A. Falcon, Chandler, AZ (US); Joshua D. Heppner, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/776,773

(22) PCT Filed: Dec. 22, 2015

(86) PCT No.: PCT/US2015/067422
§ 371 (c)(1),
(2) Date: May 16, 2018

(87) PCT Pub. No.: WO2017/111952
PCT Pub. Date: Jun. 29, 2017

(65) Prior Publication Data
US 2018/0337135 A1    Nov. 22, 2018

(51) Int. Cl.
*H01L 23/538* (2006.01)
*H01L 23/00* (2006.01)
(Continued)

(52) U.S. Cl.
CPC ........ *H01L 23/5389* (2013.01); *H01L 21/486* (2013.01); *H01L 21/561* (2013.01);
(Continued)

(58) Field of Classification Search
CPC . H01L 25/042; H01L 25/0655; H01L 25/072; H01L 25/0753; H01L 25/115;
(Continued)

(56) References Cited

U.S. PATENT DOCUMENTS 5,841,193 A  *  11/1998  Eichelberger ....... H01L 23/5389
                                                    257/723
6,271,469 B1 *   8/2001  Ma .......................... H01L 21/56
                                                    174/521
(Continued)

FOREIGN PATENT DOCUMENTS

TW    201526122    7/2015
TW    201537680    10/2015

OTHER PUBLICATIONS

International Search Report and Written Opinion for International Patent Application No. PCT/US2015/067422 dated Sep. 20, 2016, 12 pgs.
(Continued)

*Primary Examiner* — David A Zarneke
(74) *Attorney, Agent, or Firm* — Schwabe, Williamson & Wyatt, P.C.

(57) ABSTRACT

Embodiments of the invention include molded modules and methods for forming molded modules. According to an embodiment the molded modules may be integrated into an electrical package. Electrical packages according to embodiments of the invention may include a die with a redistribution layer formed on at least one surface. The molded module may be mounted to the die. According to an embodiment, the molded module may include a mold layer and a plurality of components encapsulated within the mold layer. Terminals from each of the components may be substantially coplanar with a surface of the mold layer in order to allow the terminals to be electrically coupled to the redistribution layer on the die. Additional embodiments of the invention
(Continued)

may include one or more through mold vias formed in the mold layer to provide power delivery and/or one or more faraday cages around components.

8 Claims, 8 Drawing Sheets

(51) Int. Cl.
*H01L 25/04* (2014.01)
*H01L 23/48* (2006.01)
*H01L 21/48* (2006.01)
*H01L 21/56* (2006.01)
*H01L 23/13* (2006.01)
*H01L 23/31* (2006.01)
*H01L 23/498* (2006.01)
*H01L 23/552* (2006.01)
*H01L 25/065* (2006.01)
*H01L 25/16* (2006.01)
*H01L 25/07* (2006.01)
*H01L 25/075* (2006.01)
*H01L 25/11* (2006.01)

(52) U.S. Cl.
CPC .......... *H01L 21/565* (2013.01); *H01L 21/568* (2013.01); *H01L 23/13* (2013.01); *H01L 23/3121* (2013.01); *H01L 23/48* (2013.01); *H01L 23/49816* (2013.01); *H01L 23/5384* (2013.01); *H01L 23/5385* (2013.01); *H01L 23/5386* (2013.01); *H01L 23/552* (2013.01); *H01L 24/19* (2013.01); *H01L 24/48* (2013.01); *H01L 24/96* (2013.01); *H01L 25/04* (2013.01); *H01L 25/0652* (2013.01); *H01L 25/0655* (2013.01); *H01L 25/16* (2013.01); H01L 24/16 (2013.01); H01L 25/042 (2013.01); H01L 25/071 (2013.01); H01L 25/072 (2013.01); H01L 25/0753 (2013.01); H01L 25/112 (2013.01); H01L 25/115 (2013.01); H01L 2224/04105 (2013.01); H01L 2224/12105 (2013.01); H01L 2224/13101 (2013.01); H01L 2224/16225 (2013.01); H01L 2224/16227 (2013.01); H01L 2224/48091 (2013.01); H01L 2224/48106 (2013.01); H01L 2224/48227 (2013.01); H01L 2224/48247 (2013.01); H01L 2224/73204 (2013.01); H01L 2224/81024 (2013.01); H01L 2225/0651 (2013.01); H01L 2225/06517 (2013.01); H01L 2225/06568 (2013.01); H01L 2225/06586 (2013.01); H01L 2924/00014 (2013.01); H01L 2924/1203 (2013.01); H01L 2924/1304 (2013.01); H01L 2924/1436 (2013.01); H01L 2924/15192 (2013.01); H01L 2924/181 (2013.01); H01L 2924/1815 (2013.01)

(58) Field of Classification Search
CPC ... H01L 25/0652; H01L 25/071; H01L 25/112
See application file for complete search history.

(56) References Cited

U.S. PATENT DOCUMENTS

| | | | | |
|---|---|---|---|---|
| 6,545,354 | B1* | 4/2003 | Aoki | H01L 23/3114 |
| | | | | 257/734 |
| 6,901,614 | B2* | 6/2005 | Holub | A47G 9/086 |
| | | | | 5/413 R |
| 7,489,032 | B2* | 2/2009 | Jobetto | H01L 23/16 |
| | | | | 257/700 |
| 7,808,073 | B2* | 10/2010 | Wakisaka | H01G 4/228 |
| | | | | 257/528 |
| 8,076,180 | B2* | 12/2011 | Meyer | H01L 21/568 |
| | | | | 257/E21.499 |
| 8,409,926 | B2* | 4/2013 | Lin | H01L 21/561 |
| | | | | 257/723 |
| 8,680,692 | B2* | 3/2014 | Chang | H01L 24/19 |
| | | | | 257/787 |
| 8,786,100 | B2* | 7/2014 | Lin | H01L 21/563 |
| | | | | 257/723 |
| 8,884,343 | B2* | 11/2014 | Lange | H01L 24/29 |
| 9,099,571 | B2* | 8/2015 | Jiang | H01L 23/5389 |
| 9,209,165 | B2 | 12/2015 | Dayringer et al. | |
| 9,281,292 | B2* | 3/2016 | Hu | H01L 25/16 |
| 9,786,487 | B2 | 10/2017 | Fehkuhrer | |
| 10,510,679 | B2* | 12/2019 | Wang | H01L 21/561 |
| 2008/0211089 | A1 | 9/2008 | Khan et al. | |
| 2010/0214759 | A1 | 8/2010 | Beddingfield et al. | |
| 2013/0343022 | A1 | 12/2013 | Hu et al. | |
| 2015/0235991 | A1 | 8/2015 | Gu et al. | |
| 2015/0318264 | A1 | 11/2015 | Yu et al. | |

OTHER PUBLICATIONS

International Preliminary Report on Patentability for PCT Patent Application No. PCT/US2015/067422 dated Jul. 5, 2018, 9 pgs.

* cited by examiner

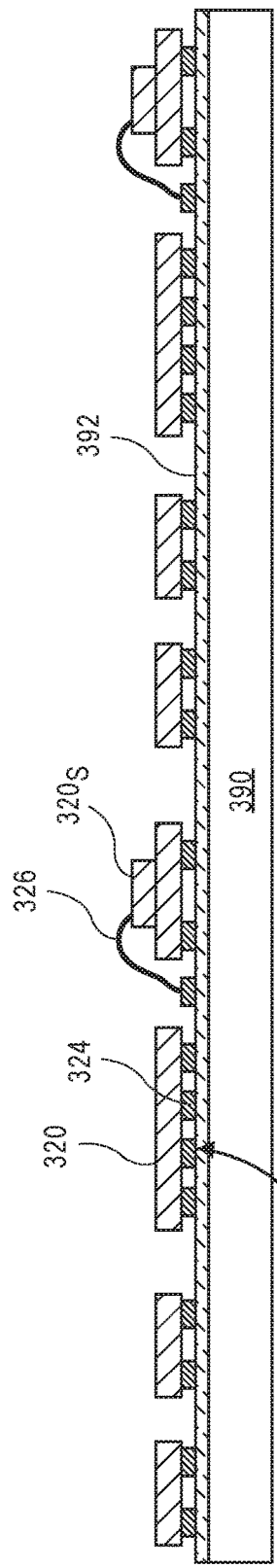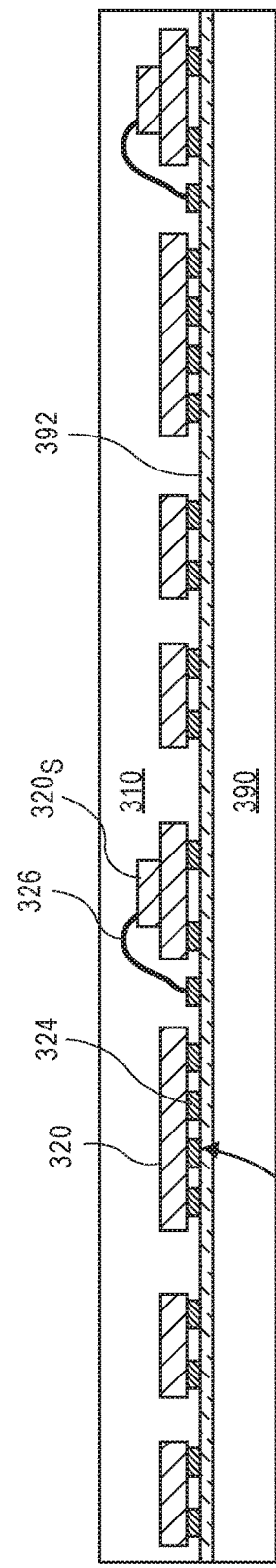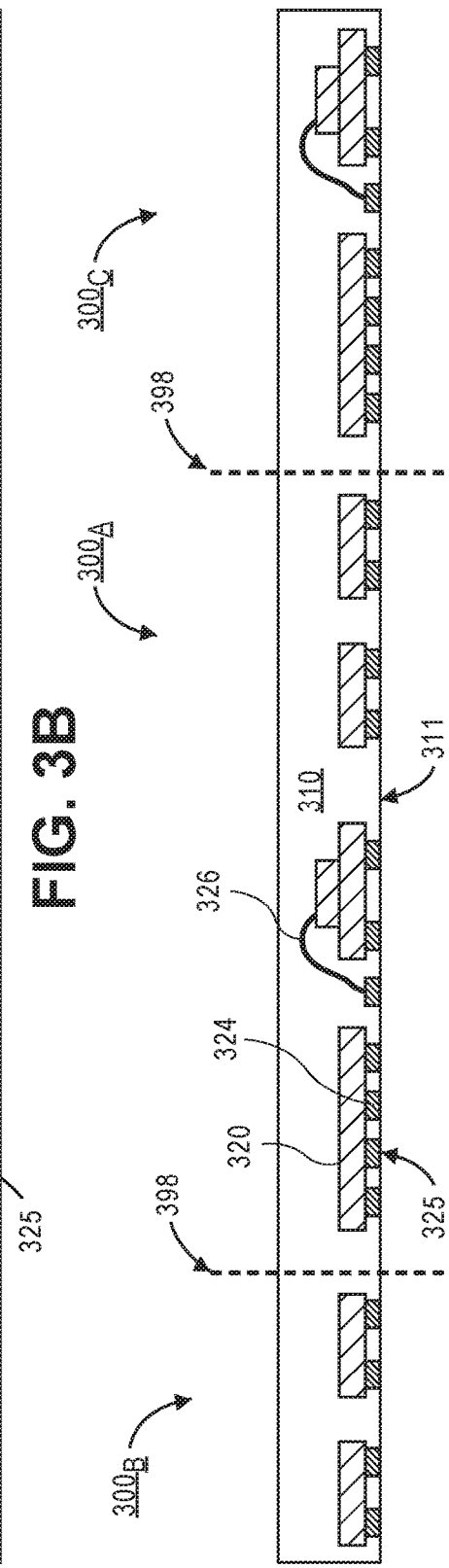

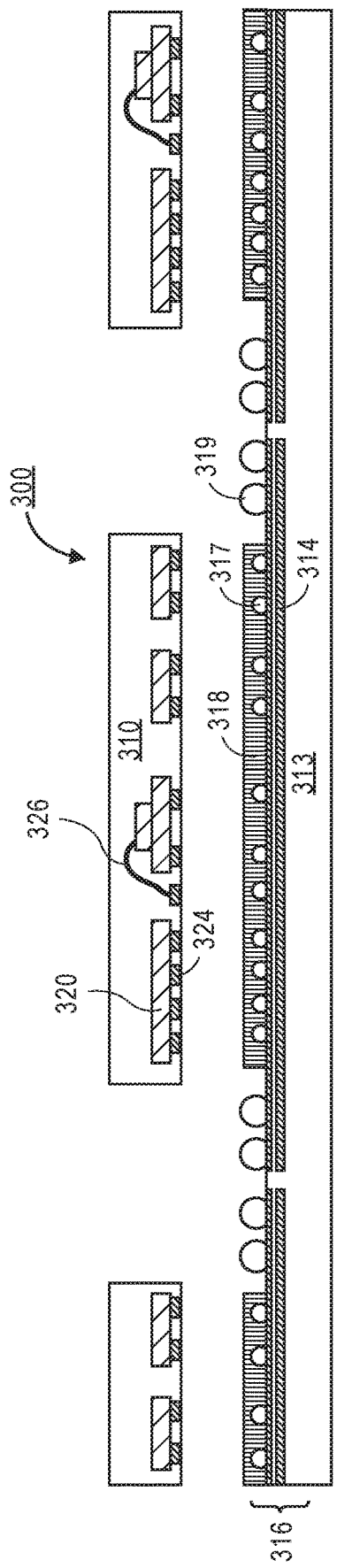
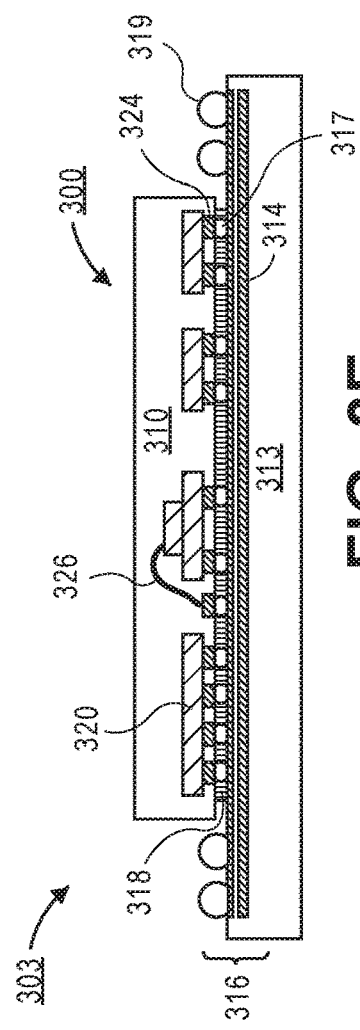

ULTRA SMALL MOLDED MODULE INTEGRATED WITH DIE BY MODULE-ON-WAFER ASSEMBLY

CROSS-REFERENCE TO RELATED APPLICATION

This patent application is a U.S. National Phase Application under 35 U.S.C. § 371 of International Application No. PCT/US2015/067422, filed Dec. 22, 2015, entitled "ULTRA SMALL MOLDED MODULE INTEGRATED WITH DIE BY MODULE-ON-WAFER ASSEMBLY," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to semiconductor packages that include molded modules that are mounted on a die surface and methods for manufacturing such devices.

BACKGROUND OF THE INVENTION

In order to provide increased flexibility in design and improve the time to market, packaging technologies (e.g., system in package (SiP), system on a chip (SoC), or the like) may include a plurality of discrete components coupled to an integrated circuit (IC) die. These additional components may be mounted to the packaging substrate, embedded within the packaging substrate, or embedded in a mold layer formed around the die. For example, components may be embedded in the mold layer formed around the die in embedded wafer level ball grid array (eWLB) or embedded panel level ball grid array (ePLB) packages. In such packages, additional components are located in the mold layer outside an outer perimeter of the die, and electrical connections from the die to the components are made with a redistribution layer (RDL) that is formed over the mold layer. Accordingly, eWLB and ePLB packages require additional surface area in the X-Y dimension in order to package the components and the die in a single mold layer.

In addition to increasing the area needed to package all of the components and the die in the same mold layer, patterning the RDL on the mold layer is limited by the minimum line width and spacing dictated by design rules. The limit for each is typically about 5 µm or greater. The line width and spacing needs to be relatively large to account for misalignment that occurs during the molding process. For example, embedded components on the edge of the wafer or panel move a significant amount due to mold flow and coefficient of thermal expansion (CTE) mismatch. The misalignment issues are becoming an even greater concern as more than one RDL is needed. Misalignment between multiple redistribution layers further decreases the reliability and yield of such packages.

Accordingly, there is a need in the art for packaging technologies that allow for the formation of reliable packages with a small footprint.

BRIEF DESCRIPTION OF THE DRAWINGS

FIG. 3A is a cross-sectional illustration of a plurality of components mounted to a temporary adhesive on a carrier substrate, according to an embodiment of the invention.

FIG. 3B is a cross-sectional illustration of FIG. 3A after a mold layer is formed over the plurality of components and the temporary adhesive, according to an embodiment of the invention.

FIG. 3C is a cross-sectional illustration of FIG. 3B after the mold layer is removed from the temporary adhesive on the carrier substrate, according to an embodiment of the invention.

FIG. 3D is a cross-sectional illustration of FIG. 3C after the mold layer is diced to form molded modules and the molded modules are positioned over a wafer that includes a plurality of integrated circuit dice, according to an embodiment of the invention.

FIG. 3E is a cross-sectional illustration of FIG. 3D after the molded modules are mounted to the wafer and the wafer is diced, according to an embodiment of the invention.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention allow for the integration of active and/or passive components with a die without increasing the footprint of the package while also allowing for increases in yield. The packaging solutions described according to embodiments of the invention are able to achieve these benefits by utilizing molded modules that include a plurality of active and/or passive components. Instead of arranging the components around a die, as described above, the molded module may be flip-chip mounted to a surface of the die.

Such packaging configurations provide several advantages. For example, flip-chip mounting the molded module to the die reduces the footprint of the package and reduces the length of the interconnect lines between the components and the die. Additionally, the RDL may be formed on the die instead of being formed over the mold layer Eliminating the redistribution layer from over the mold layer reduces fabrication costs compared to molding solutions such as eWLB and ePLB structures that need an RDL over the mold. Instead of forming the RDL on the molded layer, a standardized pad layout can be patterned on the die with inexpensive backend masks. Moving the formation of the RDL from the mold layer to the die also leverages the fine line width and spacing design rules available in backend processing and can therefore produce finer pitched interconnects. Furthermore, the yield can be increased when no lithography is required on the mold layer after embedding the components. Terminals of the components remain exposed and can be easily screened to ensure that only functional molded modules are used in subsequent assembly of the package.

Figure 1A:
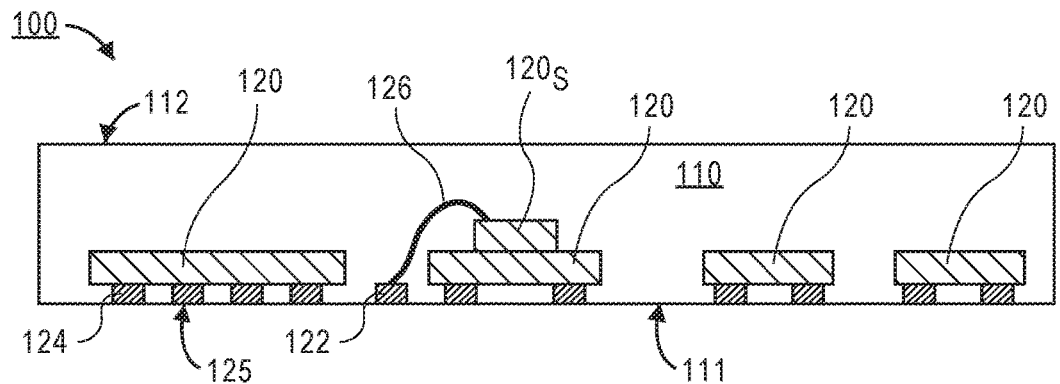
FIG. 1A is a cross-sectional illustration of a molded module, according to an embodiment of the invention.

Referring now to FIG. 1A, a cross-sectional illustration of a molded module 100 is shown according to an embodiment of the invention. The molded module 100 may include a plurality of components 120 embedded in a mold layer 110. The plurality of components 120 may include one or more active or passive devices. For example, passive components 120 may include capacitors, resistors, inductors, or the like, and active components 120 may include transistors, diodes, power sources, or the like. The number and type of components 120 that are included in the molded module 100 may be dependent on the desired use of the molded module 100. The flexibility in the number and type of components 120 that may be used allows for rapid design and integration of the molded module 100 into packaged devices, therefore allowing for quicker time to market.

As illustrated, each of the components 120 may include terminals 124 that are positioned along a first surface 111 of the mold layer 110. In an embodiment, each of the terminals 124 may include a surface 125 that is substantially coplanar with the first surface 111 of the mold layer 110. Additional embodiments may include components 120s that are stacked over another component 120. In such embodiments, one or more wire bonds 126 may be embedded in the mold layer 110 to provide a conductive path between the stacked component 120s and a pad 122 formed along the first surface 111 of the mold layer 110. According to an additional embodiment of the invention, one or more of the components 120 or 120s may also extend above the mold layer (i.e., the entire component may not be embedded in the mold layer).

As illustrated, the terminals 124 and pads 122 are not covered by a redistribution layer (RDL). In such embodiments, an RDL may be included on the integrated circuit die (not shown in FIG. 1A) instead of on the mold layer 110. The use of molded modules without an RDL formed over the contacts also allows for quick inspection of the components. For example, good units can be easily screened and then good sub-assembly screened with a socket test prior to assembly. Accordingly, molded modules 100 that have defective components can be prevented from being included in the finished package, which produces an increase in the yield.

Figure 1B:
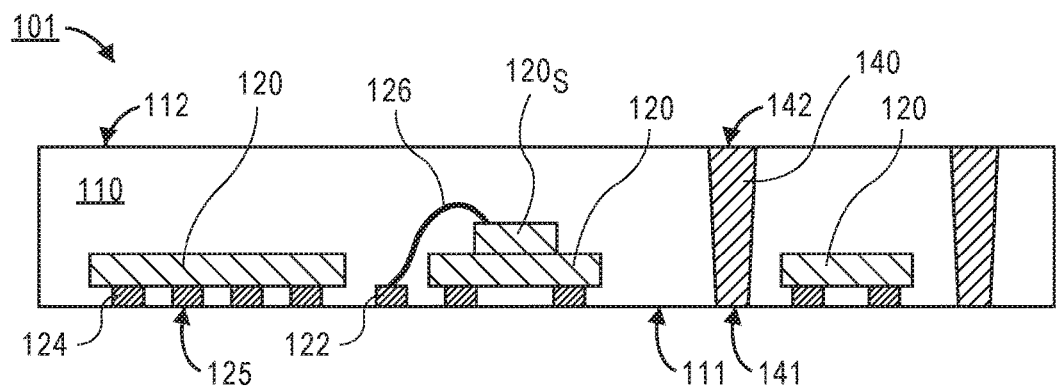
FIG. 1B is a cross-sectional illustration of a molded module that includes a plurality of through mold vias, according to an embodiment of the invention.

Referring now to FIG. 1B, a cross-sectional illustration of a molded module 101 that includes a plurality of through mold vias 140 formed through the mold layer 110 is shown according to an embodiment of the invention. The through mold vias 140 provide a conductive pathway through the mold layer 110. Accordingly, embodiments of the invention may include through mold vias 140 that have a first surface 141 that is substantially coplanar with a first surface 111 of the mold layer 110 and a second surface 142 that is substantially coplanar with a second surface 112 of the mold layer 110. However, it is to be appreciated that the second surface 112 of the mold layer 110 may not be completely planar. For example, embodiments of the invention may also include a surface with one or more cavities or a stepped surface. As such, the entire second surface 112 of the mold layer does not need to be substantially coplanar with a second surface 142 of the through mold vias 140, according to some embodiments of the invention. An example of such an embodiment is illustrated and described in greater detail below with respect to FIG. 2C.

The use of through mold vias 140 provides several advantages. In one embodiment, a plurality of through mold vias 140 may be used to form a faraday cage around one or more components 120 that need to be isolated from interference. In the illustrated embodiment, a via 140 is formed on either side of a component 120, and it is to be appreciated that additional through mold vias 140 may be formed around the component 120 in planes that are not visible in the illustrated cross-sectional view. Additionally, the use of through mold vias 140 may allow for a connection to be made from an integrated circuit die to a package substrate through the molded module 101. In such embodiments, the molded module 101 may include one or more through mold vias 140 to produce the desired number of connections.

In the embodiment illustrated in FIG. 1B, the through mold vias 140 have tapered sidewalls. Tapered sidewalls may be formed when a laser drilling process is used to define via openings. However embodiments are not limited to through mold vias 140 that have tapered sidewalls. For example, pins and/or via bars may be used instead of laser drilled through mold vias 140. In such embodiments, the sidewalls may be substantially vertical. Molded modules that include pins or via bars, and processes for forming through mold vias 140, are described in greater detail below.

Figure 1C:
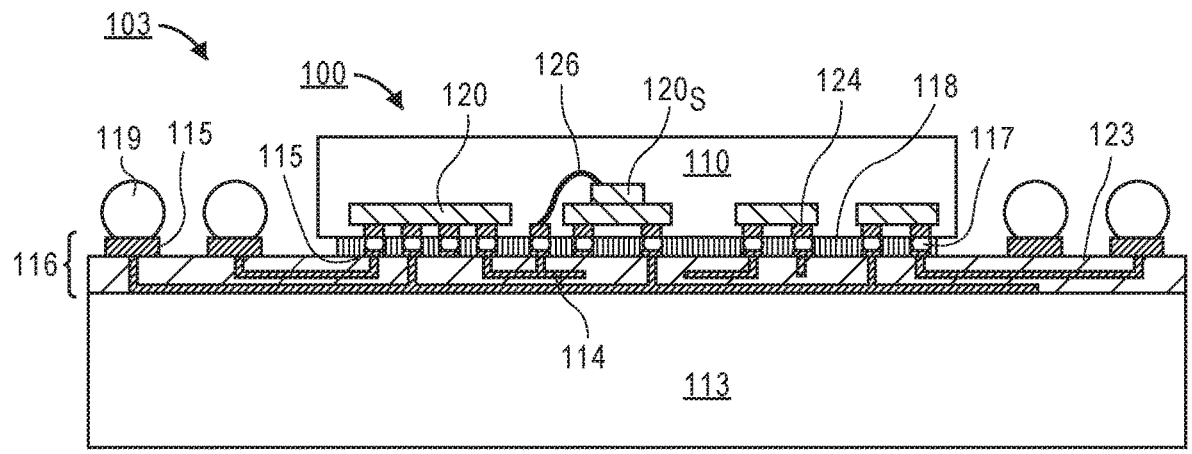
FIG. 1C is a cross-sectional illustration of a molded module that is mounted to a die, according to an embodiment of the invention.

Referring now to FIG. 1C, a cross-sectional illustration of an assembly 103 that includes a molded module 100 that is electrically and mechanically coupled to a die 113 is shown according to an embodiment of the invention. The illustrated embodiment includes a molded module 100 that is substantially similar to the molded module 100 described above with respect to FIG. 1A. However, it is appreciated that any molded module formed in accordance with embodiments of the invention may be mounted to a die 113. For example, a molded module that includes through mold vias 140, such as the molded module 101 illustrated in FIG. 1B, may also be mounted to the die 113. According to an embodiment, the die 113 may be any active device. For example, the die 113 may be an integrated circuit (IC) device or an interposer (e.g., a system on a chip (SoC), an antenna chip, a sensor, a radio frequency (RF) die, or the like).

According to an embodiment, the molded module 100 may be mounted directly to the die 113 with a plurality of solder bumps 117. For example, the solder bumps 117 may be controlled collapse chip connection (C4) bumps which may also be referred to as flip-chip connections. According to an embodiment, a flux 118 may also be formed over the solder bumps 117. Embodiments of the invention may utilize any suitable flux 118 that aids in the formation of reliable electrical connections between the solder bumps 117 and the terminals 124. For example, the flux 118 may be an epoxy based flux or the like.

Since the molded module 100 does not include an RDL, an RDL 116 may be formed over the die 113. Forming the RDL 116 on the die 113 may allow for increased routing density for the conductive traces and vias 114 of the RDL 116 because finer line width and spacing are available in the backend fabrication processes used to form the die 113. According to an embodiment, the conductive traces and vias 114 may be formed in one or more dielectric layers 123 and may electrically couple the terminals 124 of the components 120 to pads 115 and solder bumps 119 located on the die 113 and/or to any circuitry within the die 113. According to an additional embodiment, the solder bumps 117 may be replaced with an anisotropic conductive paste or film. In such an embodiment, the combination of pressure from the mounting process and heat allows for conductive paths to be formed in the anisotropic paste between the terminals 124 and the contacts on the RDL 116 of the die 113.

Figure 2A:
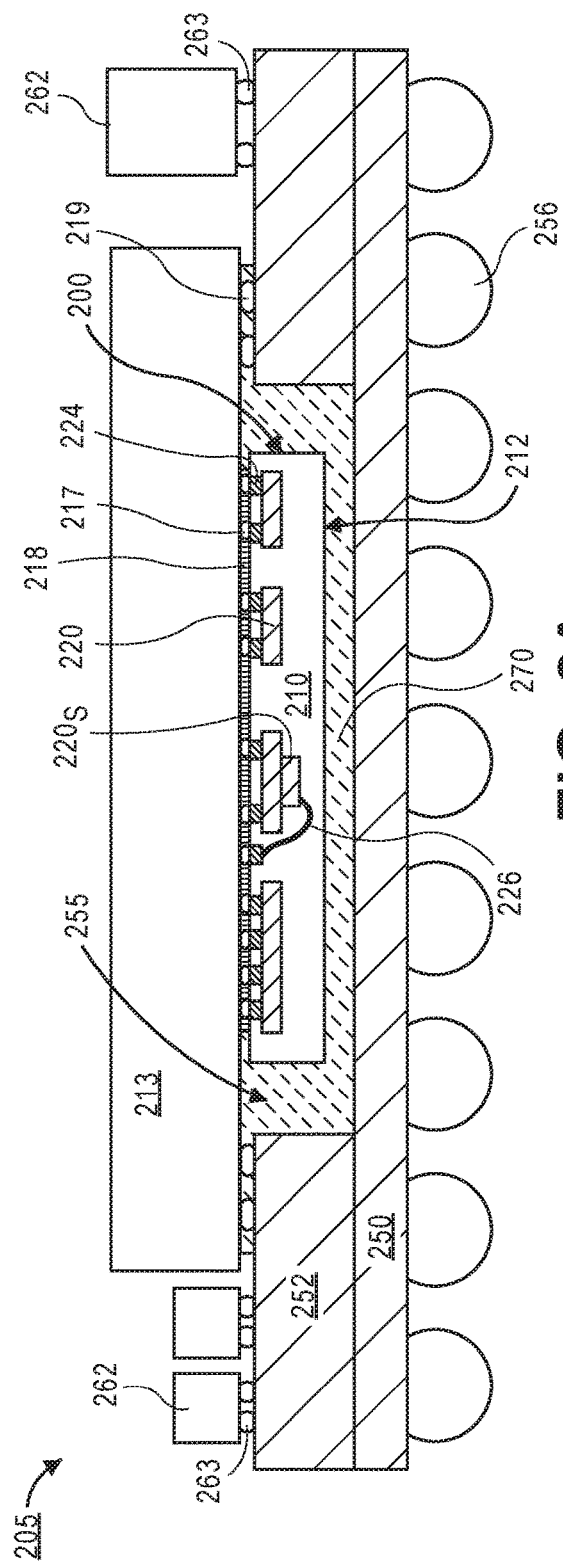
FIG. 2A is a cross-sectional illustration of a molded module and a die that is flip-chip mounted to a package substrate, according to an embodiment of the invention.

Referring now to FIG. 2A, a cross-sectional illustration of a package 205 is shown according to an embodiment of the invention. Package 205 may include a die 213 that is flip-chip mounted to a package substrate. According to an embodiment, one or more molded modules 200 may be electrically coupled to the die 213. In the illustrated embodiment, a single molded module 200 is shown, but it is to be appreciated that more than one molded module may be used according to additional embodiments. In some embodiments the die 213 may be mounted on an interposer 252. The interposer 252 includes an opening 255 that forms a cavity that accommodates the placement of the molded module 200 between the die 213 and the package substrate 250. Embodiments of the invention may include a cavity fill material 270 that fills the remaining portion of the cavity that is not occupied by the molded module. The cavity fill material 270 may be any suitable cavity fill material, such as an epoxy or a filled epoxy.

In the embodiment illustrated in FIG. 2A, the components 220 that are embedded in the mold layer 220 are illustrated as having terminals 224 that are coupled to the die 213 by solder bumps 217 covered by flux 218. It is to be appreciated that the solder bumps 217 may be coupled to an RDL (not shown) in the die 213. The redistribution layers in the die may be substantially similar to the RDL 116 layers illustrated in FIG. 1C and are omitted from FIG. 2A in order to not unnecessarily obscure the figure.

Embodiments of the invention may also include one or more components 262 that are mounted to the interposer 252. The components 262 may be any needed component, such as an active or passive component. The interposer 252 and the package 250 may include one or more routing layers (not shown) that electrically couple the solder bumps 219 and 263 to second level interconnects 256 on the opposite side of the package substrate 250. The second level interconnects 256 may be solder bumps or the like, and may be used to electrically and mechanically couple the package 205 to a substrate, such as a motherboard or the like.

Figure 2B:
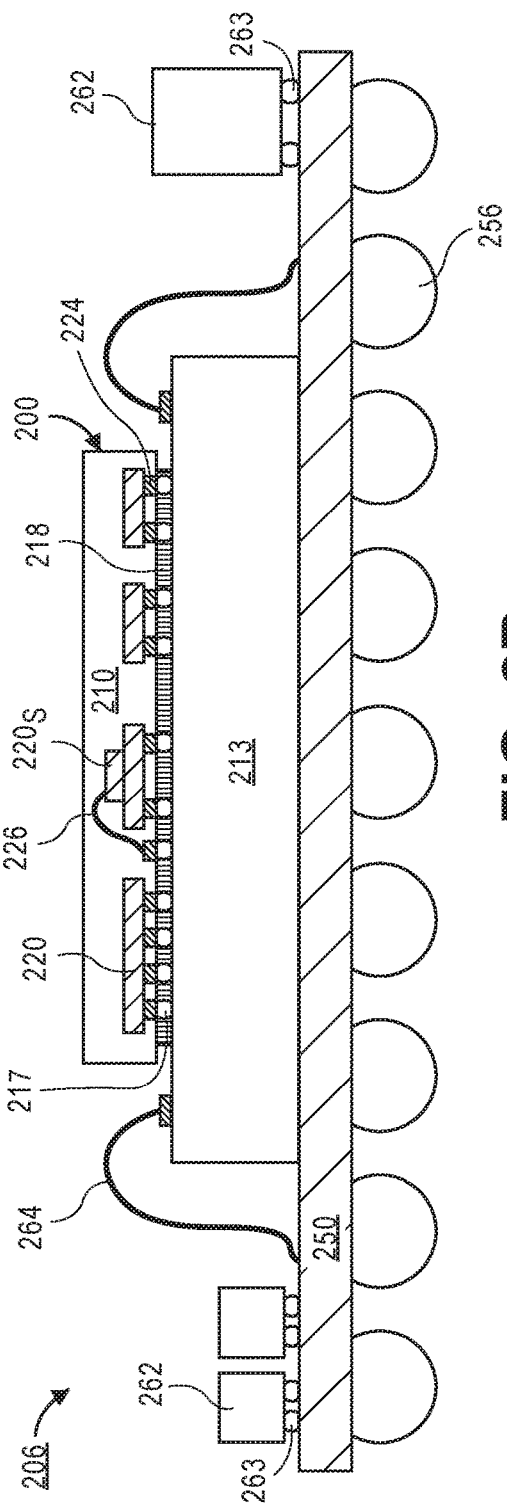
FIG. 2B is a cross-sectional illustration of a molded module and a die that is wire bonded to a package substrate, according to an embodiment of the invention.

Referring now to FIG. 2B, a cross-sectional illustration of a package 206 that includes a molded module 200 formed on a die 213 is shown according to an embodiment of the invention. The package 206 is similar to the package 205 illustrated in FIG. 2A, with the exception that the die 213 is wirebonded to the package substrate 250 with wires 264 instead of being flip-chip bonded. In such embodiments, there may not be a need for a cavity since the molded module 200 is not positioned between the die 213 and the package substrate 250. Therefore, the interposer 252 may be omitted.

Figure 2C:
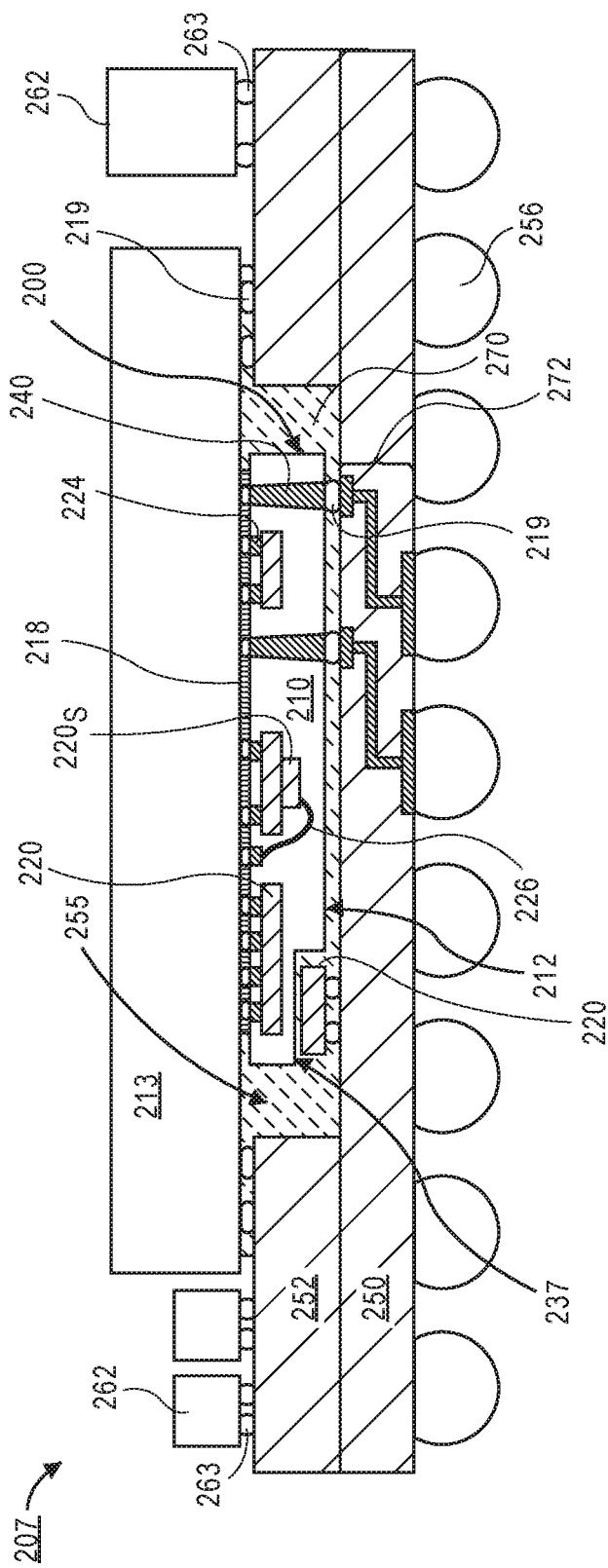
FIG. 2C is a cross-sectional illustration of a molded module that includes a plurality of through mold vias that electrically couple the die to a package substrate, according to an embodiment of the invention.

Referring now to FIG. 2C, a cross-sectional illustration of a package 207 that includes a molded module 200 with through mold vias 240 is shown according to an embodiment of the invention. Embodiments of the invention include a package 207 that is substantially similar to the package 205 illustrated in FIG. 2A, with the exception that the molded module 200 may include one or more through mold vias 240. The through mold vias 240 are substantially similar to those described above with respect to FIG. 1B, and therefore will not be described in greater detail here. The use of through mold vias 240 allows for connections from the package substrate 250 to be made to the die 213 through the molded module 200. Additionally, conductive lines and vias 272 in the package substrate 250 may electrically couple the through mold vias 240 to one or more of the second level interconnects 256. In some embodiment, the through mold vias 240 may be used for power delivery and/or for the formation of one or more faraday cages around components 220.

FIG. 2C also illustrates a stepped mold surface that may be included in different embodiments of the invention. As illustrated, the second surface 212 of the mold layer may have a step or cavity 237. The step or cavity 237 may be formed during the molding process used to form the mold layer 210. In such an embodiment, the step or cavity 237 may allow for one or more additional components 220 to be mounted on the package substrate 250 below the mold layer. Accordingly, additional surface area available for mounting components 220 may be provided when embodiments that include a step or cavity 237 are used.

Referring now to FIGS. 3A-3E, cross-sectional illustrations of different processing operations used to form molded modules that may be mounted to a die are shown according to an embodiment of the invention.

Referring now to FIG. 3A, a cross-sectional illustration of a carrier substrate 390 after a plurality of components 320 are mounted on a temporary adhesive 392 is shown according to an embodiment of the invention. Embodiments of the invention may include a carrier substrate 390 that is any suitable material for mounting components 320. For example, the carrier substrate 390 may be a stainless steel plate, an organic panel or plate, a silicon, sapphire, or glass wafer, or the like. Increasing the size of the carrier substrate 390 allows for more molded modules to be formed with a single process flow, thereby increasing the throughput. The components 320 may include one or more active or passive devices. For example, passive components 320 may include capacitors, resistors, inductors, or the like, and active components 320 may include transistors, diodes, power sources, or the like. The number and type of components 320 that are mounted to the temporary adhesive 392 may be dependent on the desired use of the molded module and how many molded modules will be formed from the process.

According to an embodiment, each of the components 320 may include terminals 324 that are mounted to the temporary adhesive 392 formed over the carrier substrate 390. In an embodiment, each of the terminals 324 may include a surface 325 that is placed in direct contact with a top surface of the adhesive layer 392. Additional embodiments may include components 320s that are stacked over other components 320. In such embodiments, a terminal 324 may be mounted to the temporary adhesive and then a wire bond 326 may electrically couple the terminal 324 to the stacked component 320s. According to an embodiment, the components 320 may be mounted to the temporary adhesive 392 with a pick and place tool. The pick and place tool may pick up individual components 320, or the pick and place tool may allow for an array of components 320 to be mounted on the carrier substrate at substantially the same time (e.g., gang bonding).

Referring now to FIG. 3B, a cross-sectional illustration of the carrier substrate 390 after a mold layer 310 is formed over the components 320 and the temporary adhesive 392 is shown according to an embodiment of the invention. The mold layer 310 may be any suitable material that can be used to encapsulate the components 320, such as epoxy, silicone, or the like. In an embodiment, the mold layer 310 may be filled with filler particles made of silica, aluminum, or the like. Additionally, embodiments of the invention may form the mold layer 310 with any suitable process, such as compression molding, transfer molding, injection molding, or any other suitable encapsulation process. It is to be appreciated that molding processes, such as these, are capable of producing a high yield because local positional movement of the components will be relatively small and global movement of components can be accommodated for during the singulation process, as described in greater detail below.

Referring now to FIG. 3C, a cross-sectional illustration of the mold layer 310 after the temporary adhesive 392 and the carrier substrate 390 are removed is shown according to an embodiment of the invention. For example, the mold layer 310 may be removed from the temporary adhesive 392 with a peeling or delamination process. The removal of the carrier substrate 390 and the temporary adhesive 392 exposes the surface 325 of the terminals 324. For example, the exposed surface 325 of the terminals 324 may be substantially coplanar with a first surface 311 of the mold layer. In some embodiments, residue that may remain on the surface 325 of the terminal 324 (e.g., residue from the temporary adhesive) may be removed with a cleaning process, such as a plasma etching process.

FIG. 3C also illustrates dashed lines 398 formed through the mold layer 310. The dashed lines 398 define the boundary between multiple molded modules formed from the same mold layer 310. For example, the dashed lines 398 in FIG. 3C illustrate the boundary between a first molded module $300_A$ and second and third molded modules $300_B$ and $300_C$. Accordingly, the dashed lines 398 indicate the locations where the mold layer 310 may be singulated. It is to be appreciated that the exact location of the dashed lines 398 may be moved depending on global movement of components 320 that may occur during the molding process. As such, even if there is global movement of the components, the singulation process can be used to account for the unwanted movement and still provide molded modules 300 that have properly aligned terminals 324.

According to an embodiment, the components 320 may be tested after the mold layer 310 is formed and the terminals 324 are exposed. Since no additional lithographic processes are needed to form an RDL over the mold layer 310, testing at this point will provide a way to screen functional molded modules from non-functional molded modules. The molded modules 300 that pass screening can then be used in subsequent assembly of the package. Accordingly, the yield of the assembled packages may be increased because only functional molded modules 300 will pass this processing step. In an embodiment the components 320 of each of the molded modules 300 may be tested before or after the mold layer is singulated.

Referring now to FIG. 3D, a cross-sectional illustration of the molded modules 300 being aligned over a wafer that includes a plurality of dies 313 is shown according to an embodiment of the invention. Since the molded modules 300 do not include an RDL, an RDL 316 may be formed on the die 313. Forming the RDL 316 on the dice 313 prior to dicing the wafer may allow for finer line width and spacing design rules that are available in the backend fabrication processes used to form the die 313. Accordingly, forming the RDL 316 on the die 313 may allow for increased routing density for the conductive traces and vias 314 of the RDL 316. The conductive traces and vias 314 in the RDL 316 may electrically couple the terminals 324 of the components 320 to solder bumps 319 located on the die 313. It is to be appreciated that the RDL 316 is illustrated in the Figures is exemplary in nature and may include any number of layers, traces, or vias, and in any desired pattern, according to various embodiments.

According to an embodiment, the molded module 300 may be mounted directly to the die 313 with a plurality of solder bumps 317. For example, the solder bumps 317 may be C4 bumps. In the illustrated embodiment, the solder bumps 317 may also include a flux 318, such as an epoxy flux. In an embodiment, the molded module 300 may be mounted to the die 313 with a thermal compression bonding (TCB) process. According to an additional embodiment, the solder bumps 317 may be replaced with anisotropic conductive paste or film. In such an embodiment, the combination of pressure from the mounting process and heat allows for conductive paths to be formed in the anisotropic conductive paste between the terminals 324 and the contacts on the RDL 316 of the die 313.

Referring now to FIG. 3E, a cross-sectional illustration of a singulated die 313 with a molded module 300 mounted on the die 313 is shown according to an embodiment of the invention. In an embodiment, the wafer may be diced with a dicing process known in the art. After the die 313 with a molded module 300 attached is formed, embodiments of the invention may further include mounting the chip to a package substrate to form a package substantially similar to those described above with respect to FIGS. 2A-2C.

In addition to the process flow described with respect to FIG. 3A-3E, embodiments of the invention may also include a process for forming conductive through mold vias in the molded module.

Figure 4A:
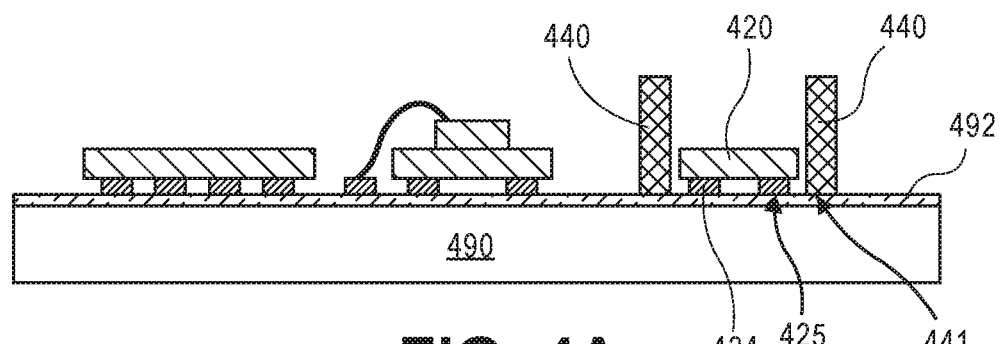
FIG. 4A is a cross-sectional illustration of a plurality of components and a plurality of via pins mounted on a temporary adhesive on a carrier substrate, according to an embodiment of the invention.

Referring now to FIG. 4A, a cross-sectional illustration of a substrate carrier after via pins 440 are mounted to the temporary adhesive 492 is shown according to an embodiment. The view illustrated in FIG. 4A is a substantially similar to the substrate carrier 390 illustrated in FIG. 3A, with the exception that only the components that will be used to form a single molded module are illustrated. It is to be appreciated that carrier substrate 490 may be supporting a plurality of components 420 used to form a plurality of molded modules. Additionally, the embodiment illustrated in FIG. 4A differs from the embodiment illustrated in FIG. 3A, because of the addition of via pins 440. As illustrated via pins 440 are formed on opposite sides of a component 420. Additional embodiments may include forming a plurality of via pins 440 around multiple sides of the component 420 in order to form a faraday cage. Alternative embodiments may include via pins 440 that are mounted at any location along the carrier substrate. Even when not used to form a faraday cage, the one or more via pins 440 may be useful in providing a direct electrical pathway between the second level interconnects and the die for signaling and/or power lines.

According to an embodiment, the via pins 440 may be any suitable conductive material that can be mounted on the temporary adhesive 492. In the illustrated embodiment, the via pins 440 have a substantially uniform width. However, embodiment are not limited to such configurations, and embodiments may include via pins 440 that include tapered sidewalls. Additional embodiments may include via pins 440 that have pads (not show) mounted on a top surface and a bottom surface (i.e., via bars). According to an embodiment, the height of the via pins 440 may be substantially similar to the height of the molded module.

Figure 4B:
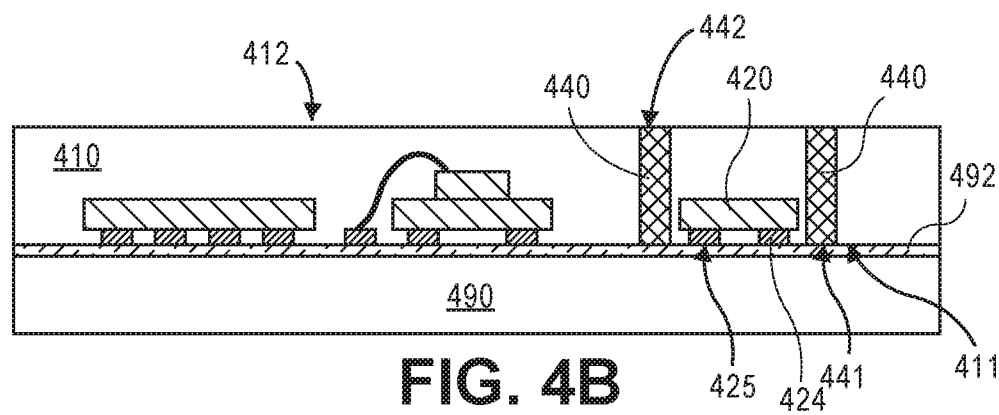
FIG. 4B is a cross-sectional illustration of FIG. 4A after a mold layer is formed over the plurality of components, the plurality of via bars, and the temporary adhesive, according to an embodiment of the invention.

Referring now to FIG. 4B, a cross-sectional illustration of a mold layer 410 that encapsulates the components 420 and the via pins 440 is shown according to an embodiment of the invention. In an embodiment, the mold layer 410 may be formed with any suitable molding material and molding process, such as those described above with respect to FIG. 3B. According to an embodiment, the mold layer 410 may have a thickness that is substantially similar to the thickness of the via pins 440. When the thickness of the mold layer 410 is substantially similar to the height of the via pins 440, a second surface 442 of the via pins 440 may be substantially coplanar with a second surface 412 of the mold layer 410. Additional embodiments of the invention may include a mold layer 410 that has a thickness that is greater than the height of the via pins 440. In such embodiments, a top surface of the mold layer may be polished back after being formed in order to expose the second surface 442 of the via pins 440. After the mold layer 410 is formed with exposed via pin surfaces 442, processing may continue in substantially the same manner as described above with respect to FIGS. 3C-3E above, and therefore, will not be repeated here.

Figure 5A:
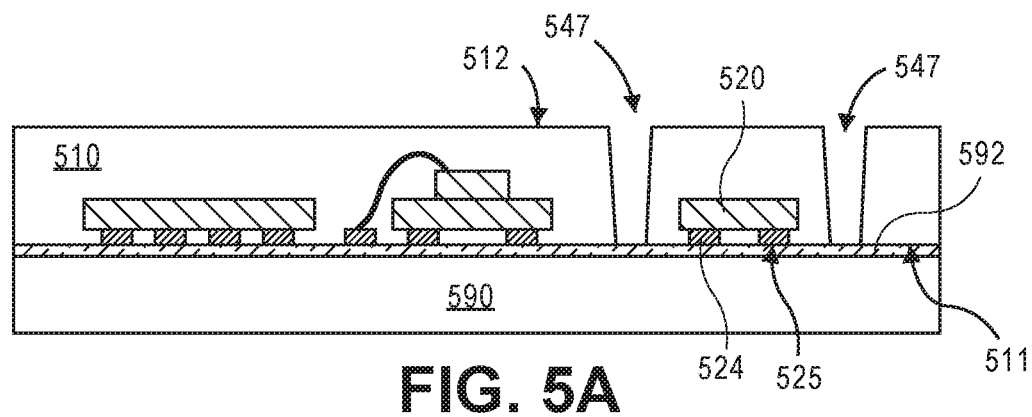
FIG. 5A is a cross-sectional illustration of a mold layer formed over a plurality of components after a plurality of via openings are formed through the mold layer, according to an embodiment of the invention.
Figure 5B:
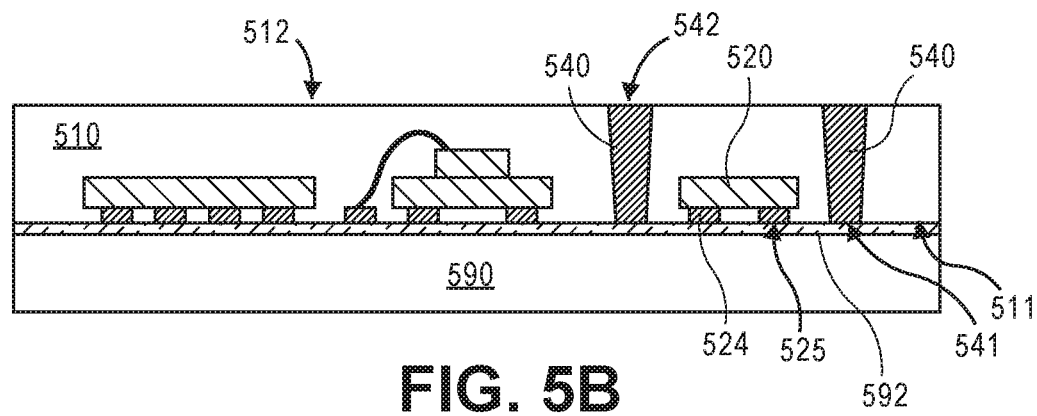
FIG. 5B is a cross-sectional illustration of FIG. 5A after a conductive material is deposited into the via openings to form a plurality of vias, according to an embodiment of the invention.

Alternative embodiments of the invention may form the through mold vias after the mold layer is formed. A process for forming vias in accordance with such an embodiment is illustrated in FIGS. 5A and 5B. Referring now to FIG. 5A, a cross-sectional illustration of a mold layer 510 that is formed over a carrier substrate is shown according to an embodiment of the invention. After the mold layer 510 is formed, one or more via openings 547 may be formed through the mold layer 510 and expose a surface of the temporary adhesive 592. In an embodiment, the via openings may be formed with a laser drilling process. Due to the laser drilling, embodiments of the invention may include tapered sidewalls.

Referring now to FIG. 5B, a cross-sectional illustration of the molded module after the vias 540 are formed in the via openings is shown according to an embodiment of the invention. Embodiments of the invention may include any suitable metal deposition process to fill the via openings. For example, the via openings may be filled with a solder paste or may be plated with an electroless or electroplating process. In some embodiments, any overburden that may form over the second surface 512 may be polished back so that a second surface 542 of the vias 540 are substantially coplanar with a second surface of the mold layer 510.

After the vias 540 are formed through the mold layer 510, processing may continue in substantially the same manner as described above with respect to FIGS. 3C-3E above, and therefore, will not be repeated here.

Alternative embodiments of the invention may form the via openings during the molding process. A process for forming via openings in accordance with such an embodiment is illustrated in FIGS. 6A-6D.

Figure 6A:
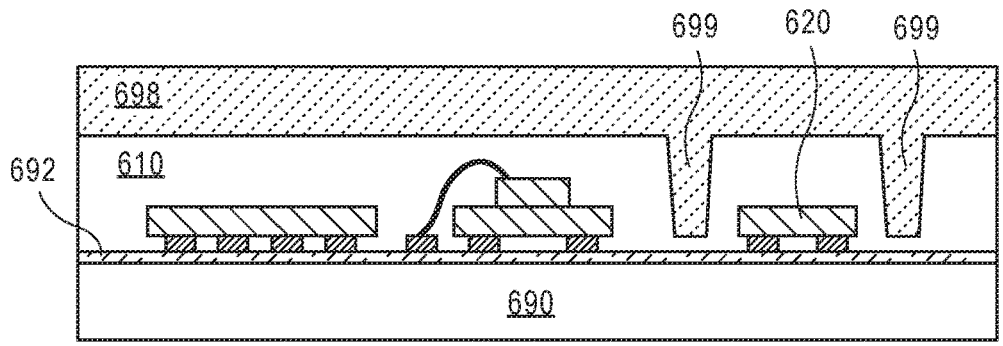
FIG. 6A is a cross-sectional illustration of a mold with via protrusions that is used to form a mold layer over a plurality of components, according to an embodiment of the invention.
Figure 6B:
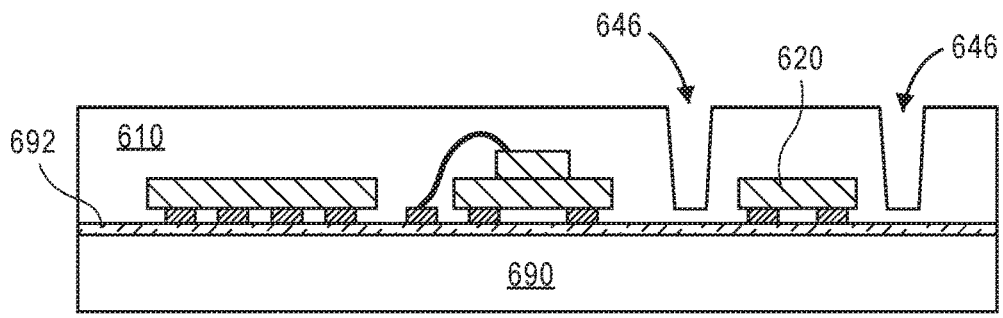
FIG. 6B is a cross-sectional illustration of FIG. 6A after the mold layer is formed with a plurality of partial via openings formed into the mold layer, according to an embodiment of the invention.

Referring now to FIG. 6A, a cross-sectional illustration of a mold 698 being used to form the mold layer 610 is shown according to an embodiment of the invention. In addition to the mold cavity used to form mold layer 610 over the components, embodiments may also include a mold 698 that includes protrusions 699 that extend into the mold layer 610. As such, when the mold layer 610 is formed, the protrusions 698 may form the via openings 646, as illustrated in the cross-sectional illustration shown in FIG. 6B.

Figure 6C:
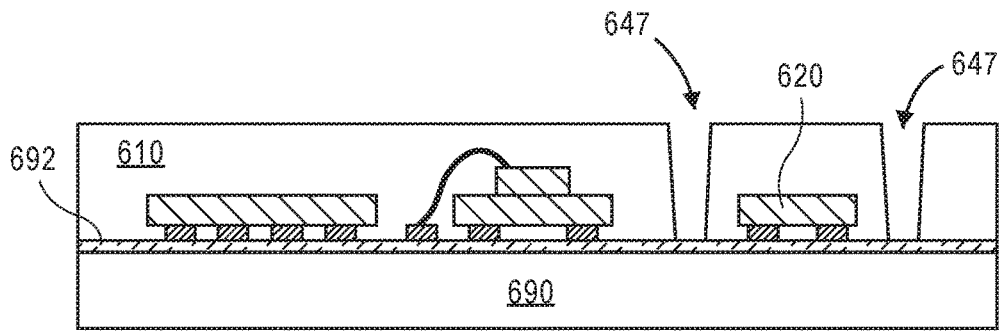
FIG. 6C is a cross-sectional illustration of FIG. 6B after the partial via openings are completely opened, according to an embodiment of the invention.

In some embodiments, the protrusions 699 do not extend completely through the mold layer 610. Accordingly, the via openings 646 may not extend completely through the mold layer 610 and a portion of the mold layer 610 may still cover the temporary adhesive 692, as illustrated in FIG. 6C. Forming the via openings 646 partially through the mold layer provides an increase in the throughput compared to laser drilling the entire opening. According to an embodiment, the throughput may be increased because the laser drilling process used to remove the remaining portion of the mold layer 610 formed below the via openings 646 may be implemented faster than the laser processing that would otherwise be needed to form an opening through the entire thickness of the mold layer 610. In alternative embodiments, the protrusions 699 on the mold 698 may completely extend through the mold layer 610, and the via openings 646 formed with the mold 698 would expose a surface of the temporary adhesive 692.

Figure 6D:
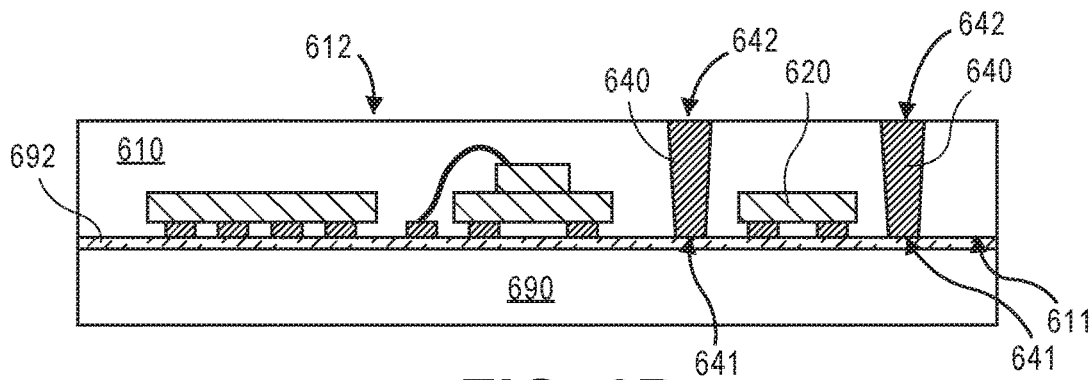
FIG. 6D is a cross-sectional illustration of FIG. 6C after a conductive material is deposited into the via openings to form a plurality of vias, according to an embodiment of the invention.
Figure 7:
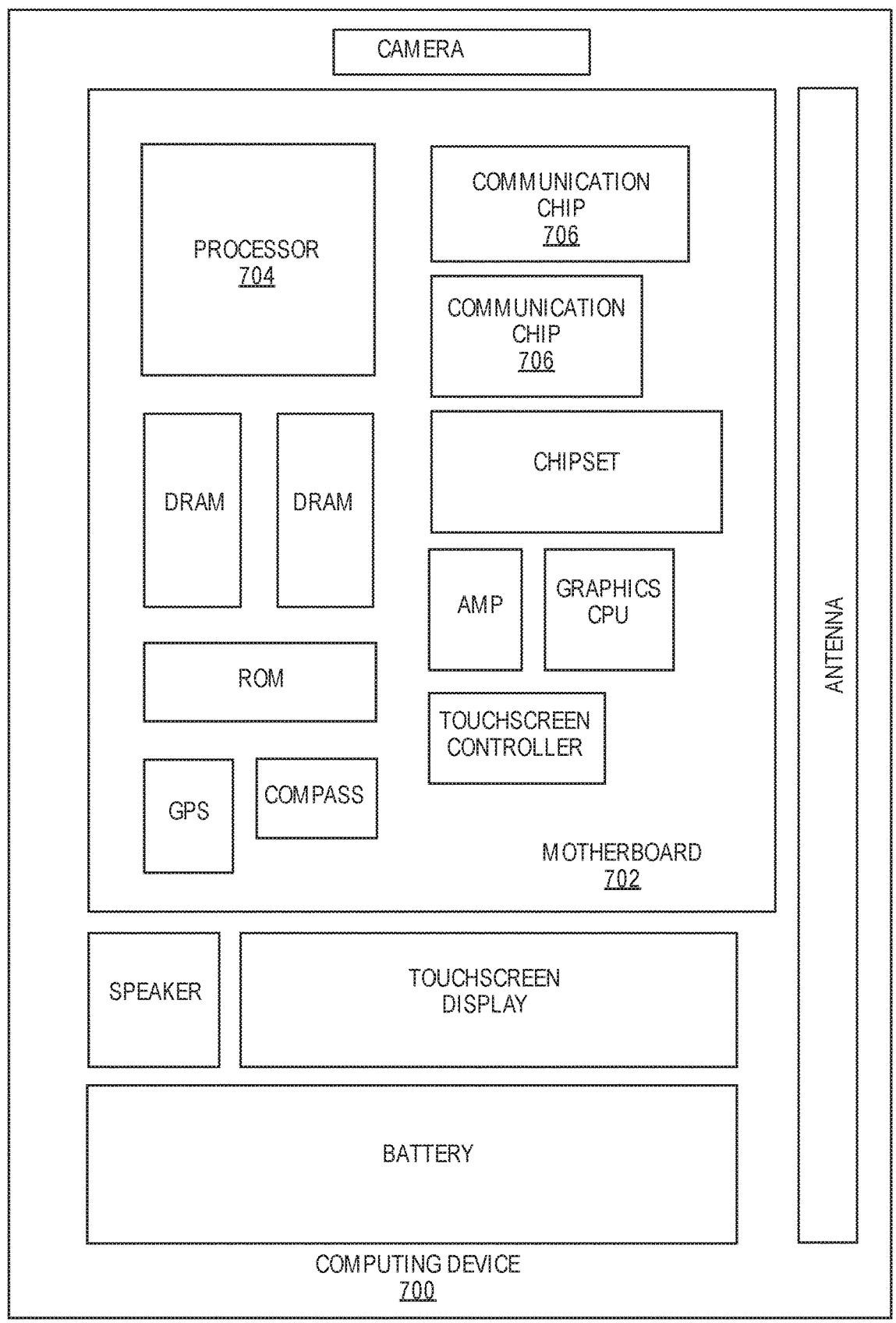
FIG. 7 is a schematic of a computing device built in accordance with an embodiment of the invention.

Referring now to FIG. 6D, a cross-sectional illustration of the molded module after the vias 640 are formed in the via openings is shown according to an embodiment of the invention. Embodiments of the invention may include any suitable metal deposition process to fill the via openings. For example, the via openings may be filled with a solder paste or may be plated with an electroless or electroplating process. In some embodiments, any overburden that may form over the second surface 612 may be polished back so that a second surface 642 of the vias 640 are substantially coplanar with a second surface of the mold layer 610.

After the vias 640 are formed through the mold layer 610, processing may continue in substantially the same manner as described above with respect to FIGS. 3C-3E above, and therefore, will not be repeated here.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices that are assembled in a package that that includes one or more molded modules that includes a plurality of components that are mounted to a die with an RDL formed on the die, in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices that are assembled in a package that that includes one or more molded modules that includes a plurality of components that are mounted to a die with an RDL formed on the die, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention may include a molded module, comprising: a mold layer having a first surface and a second surface that is opposite to the first surface; and a plurality of components encapsulated within the mold layer, wherein each of the components include terminals that are substantially coplanar with the first surface of the mold layer.

Additional embodiments of the invention include a molded module, further comprising one or more through mold vias, wherein the through mold vias include a first surface that is substantially coplanar with the first surface of the mold layer and a second surface that is substantially coplanar with the second surface of the mold layer.

Additional embodiments of the invention include a molded module, wherein the through mold vias have tapered sidewalls.

Additional embodiments of the invention include a molded module, wherein the through mold vias have substantially vertical sidewalls.

Additional embodiments of the invention include a molded module, wherein the through mold vias are conductive pins or via bars.

Additional embodiments of the invention include a molded module, wherein a plurality of through mold vias are arranged around one or more components to form a faraday cage.

Additional embodiments of the invention include a molded module, wherein the components include active and/or passive components.

Additional embodiments of the invention include a molded module, further comprising one or more stacked components that are electrically coupled to a pad with a wire bond.

Additional embodiments of the invention include a molded module, wherein the pad has a surface that is substantially coplanar with the first surface of the mold layer.

Embodiments of the invention include an electrical package comprising: a die with a redistribution layer formed on at least one surface; a molded module mounted to the die, wherein the molded module comprises: a mold layer having a first surface and a second surface that is opposite to the first surface; and a plurality of components encapsulated within the mold layer, wherein each of the components include terminals that are substantially coplanar with the first surface of the mold layer, and wherein the terminals are electrically coupled to the redistribution layer on the die.

Additional embodiments of the invention include an electrical package, wherein the terminals in the molded module are electrically coupled to the redistribution layer on the die with solder bumps.

Additional embodiments of the invention include an electrical package, wherein the terminals in the molded module are electrically coupled to the redistribution layer on the die with an anisotropic film or paste.

Additional embodiments of the invention include an electrical package, further comprising: a package substrate coupled to the die with first level interconnects.

Additional embodiments of the invention include an electrical package, wherein the molded module is positioned between the die and the package substrate.

Additional embodiments of the invention include an electrical package, further comprising an interposer formed between the die and the package substrate, wherein the interposer forms a cavity that accommodates the molded module.

Additional embodiments of the invention include an electrical package, wherein the first level interconnects are wire bonds.

Additional embodiments of the invention include an electrical package, wherein the die is positioned between the molded module and the package substrate.

Embodiments of the invention include a method of forming a molded module, comprising: mounting a plurality of components on a temporary adhesive formed over a carrier substrate, wherein the components each have terminals that are in contact with the temporary adhesive; encapsulating the plurality of components with a mold layer; and removing the temporary adhesive and the carrier substrate from the mold layer, wherein the terminals are exposed and are substantially coplanar with a first surface of the mold layer.

Additional embodiments of the invention include a method, further comprising: singulating the mold layer to form a plurality of molded modules.

Additional embodiments of the invention include a method, further comprising: mounting at least one of the molded modules to a die, wherein the die includes a redistribution layer.

Additional embodiments of the invention include a method, further comprising: forming one or more via openings in the mold layer; and disposing a conductive material in the one or more via openings to form through mold vias.

Additional embodiments of the invention include a method, wherein the via openings are formed with a laser drilling process.

Additional embodiments of the invention include a method, further comprising: mounting one or more conductive pins on the temporary adhesive; and forming the mold layer to a thickness that exposes a surface of the conductive pins.

Additional embodiments of the invention include a method, wherein forming the mold layer includes forming a one or more partial via openings.

Additional embodiments of the invention include a method, further comprising: forming one or more via openings in the mold layer by laser drilling portions of the mold layer below the partial via openings; and disposing a conductive material in the one or more via openings to form through mold vias.

What is claimed is:

1. An electrical package comprising:
   a die with a redistribution layer on at least one surface of the die;
   a molded module mounted to the die, wherein the molded module comprises:
      a mold layer having a first surface and a second surface that is opposite to the first surface, and wherein the mold layer has a first width that is smaller than a second width of the die; and
      a plurality of components encapsulated within the mold layer, wherein each of the components include terminals that are substantially coplanar with the first surface of the mold layer, and wherein the terminals are electrically coupled to the redistribution layer on the die.

2. The electrical package of claim 1, wherein the terminals in the molded module are electrically coupled to the redistribution layer on the die with solder bumps.

3. The electrical package of claim 1, wherein the terminals in the molded module are electrically coupled to the redistribution layer on the die with an anisotropic film or paste.

4. The electrical package of claim 1, further comprising: a package substrate coupled to the die with first level interconnects.

5. The electrical package of claim 4, wherein the molded module is positioned between the die and the package substrate.

6. The electrical package of claim 5, further comprising an interposer formed between the die and the package substrate, wherein the interposer forms a cavity that accommodates the molded module.

7. The electrical package of claim 4, wherein the first level interconnects are wire bonds.

8. The electrical package of claim 7, wherein the die is positioned between the molded module and the package substrate.

* * * * *